(12) United States Patent
Hwang et al.

(10) Patent No.: US 10,492,296 B2
(45) Date of Patent: Nov. 26, 2019

(54) CONDUCTIVE SUBSTRATE AND METHOD FOR MANUFACTURING SAME

(71) Applicant: LG DISPLAY CO., LTD., Seoul (KR)

(72) Inventors: Ji Young Hwang, Daejeon (KR); Jiehyun Seong, Daejeon (KR); Yong Goo Son, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/030,423

(22) Filed: Jul. 9, 2018

(65) Prior Publication Data

US 2018/0368258 A1 Dec. 20, 2018

Related U.S. Application Data

(62) Division of application No. 14/442,964, filed as application No. PCT/KR2013/011072 on Dec. 2, 2013, now Pat. No. 10,051,731.

(30) Foreign Application Priority Data

Nov. 30, 2012 (KR) .......................... 10-2012-0138340
Nov. 30, 2012 (KR) .......................... 10-2012-0138364

(51) Int. Cl.
*H05K 3/02* (2006.01)
*H05K 1/09* (2006.01)
(Continued)

(52) U.S. Cl.
CPC ................. *H05K 1/09* (2013.01); *C25D 5/02* (2013.01); *H01B 1/023* (2013.01); *H01L 51/0023* (2013.01); *H01L 51/445* (2013.01); *H05K 1/0298* (2013.01); *H05K 3/06* (2013.01); *H05K 3/46* (2013.01); *H01L 51/442* (2013.01); *H01L 51/5215* (2013.01); *H01L 51/5234* (2013.01); *H01L 2251/305* (2013.01); *H01L 2251/308* (2013.01); *H05K 2201/0326* (2013.01); *H05K 2201/0329* (2013.01); *Y02E 10/549* (2013.01); *Y02P 70/521* (2015.11)

(58) Field of Classification Search
CPC ........... H05K 3/02; H05K 3/022; H05K 3/025
See application file for complete search history.

(56) References Cited

U.S. PATENT DOCUMENTS

2004/0195571 A1* 10/2004 Ahn ................. H01L 21/76838
257/72
2005/0142976 A1 6/2005 Suzuki
(Continued)

FOREIGN PATENT DOCUMENTS

JP 05-151840 A 6/1993
JP 08-271921 A 10/1996
(Continued)

Primary Examiner — Jeremy C Norris
(74) Attorney, Agent, or Firm — Dentons US LLP

(57) ABSTRACT

An exemplary embodiment of the present invention comprises: 1) forming a crystalline transparent conducting layer on a substrate; 2) forming an amorphous transparent conducting layer on the crystalline transparent conducting layer; 3) forming at least one pattern open region so as to expose a part of the crystalline transparent conducting layer by patterning the amorphous transparent conducting layer; and 4) forming a metal layer in the at least one pattern open region.

14 Claims, 5 Drawing Sheets

[Deposition and Crystallization of ITO]

[Deposition of Amorphous ITO]

[Patterning of Amorphous ITO]

[Metal Electroplating]

[PR Peeling / Heat Treating]

[Metal Oxidization Processing]

(51) Int. Cl.
*H05K 3/46* (2006.01)
*H05K 1/02* (2006.01)
*H01L 51/00* (2006.01)
*H05K 3/06* (2006.01)
*C25D 5/02* (2006.01)
*H01L 51/44* (2006.01)
*H01B 1/02* (2006.01)
*H01L 51/52* (2006.01)

(56) References Cited

U.S. PATENT DOCUMENTS

| | | | |
|---|---|---|---|
| 2011/0316039 A1 | 12/2011 | Liu | ............... H01L 33/38 257/99 |
| 2012/0009725 A1 | 1/2012 | Inoue et al. | |
| 2012/0138999 A1 | 6/2012 | Okabe | ............... H01L 33/405 257/98 |
| 2013/0256008 A1 | 10/2013 | Zeng | ............... H01H 11/00 174/257 |

FOREIGN PATENT DOCUMENTS

| | | |
|---|---|---|
| JP | 2002-170688 A | 6/2002 |
| JP | 2003-115391 A | 4/2003 |
| JP | 2010-108684 A | 5/2010 |
| JP | 2010108684 A | 5/2010 |
| JP | 2011003456 A | 1/2011 |
| KR | 10-1026804 B1 | 4/2011 |
| KR | 10-2012-0081876 A | 7/2012 |
| TW | 200522792 A | 7/2005 |
| TW | 200735371 A | 9/2007 |

* cited by examiner

[Figure 1]
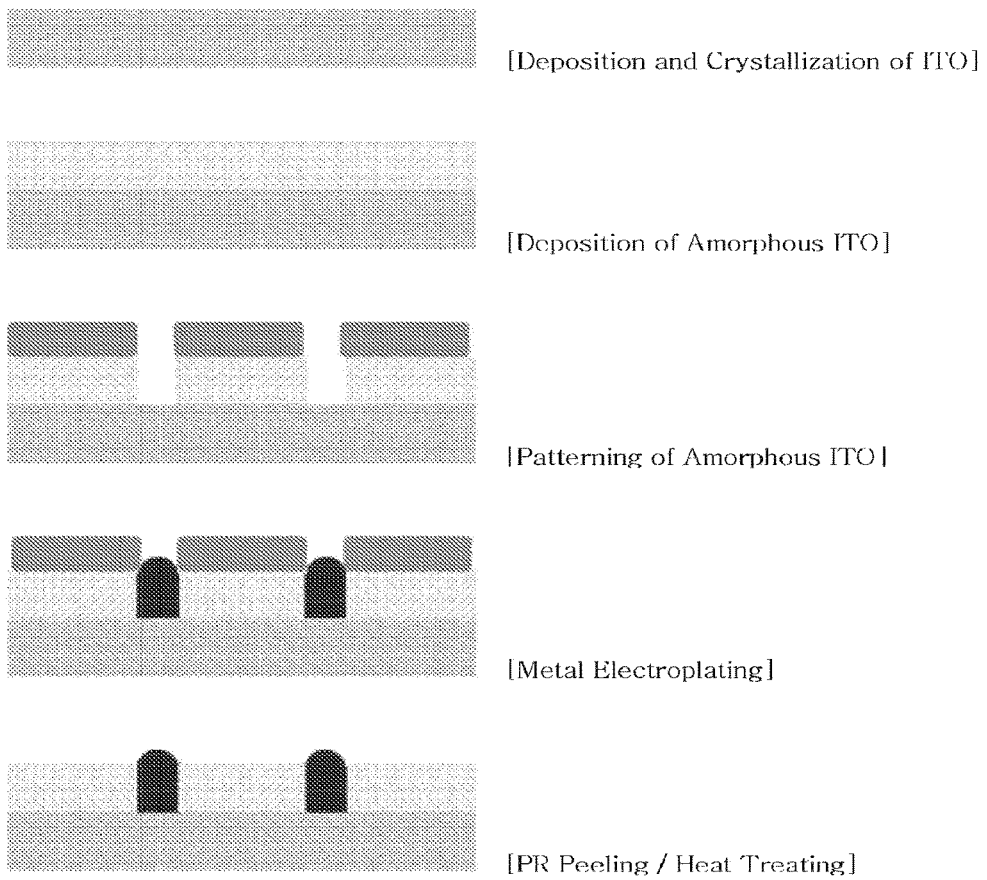

[Figure 2]
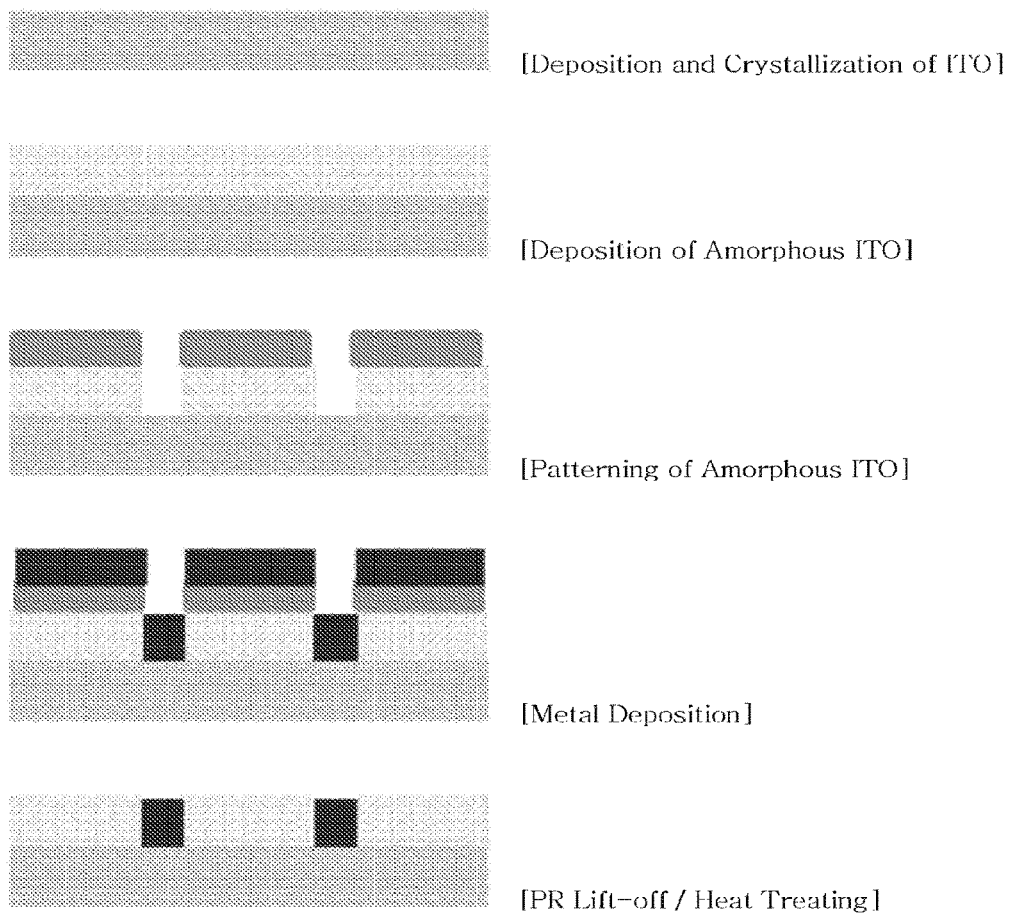

[Figure 3]
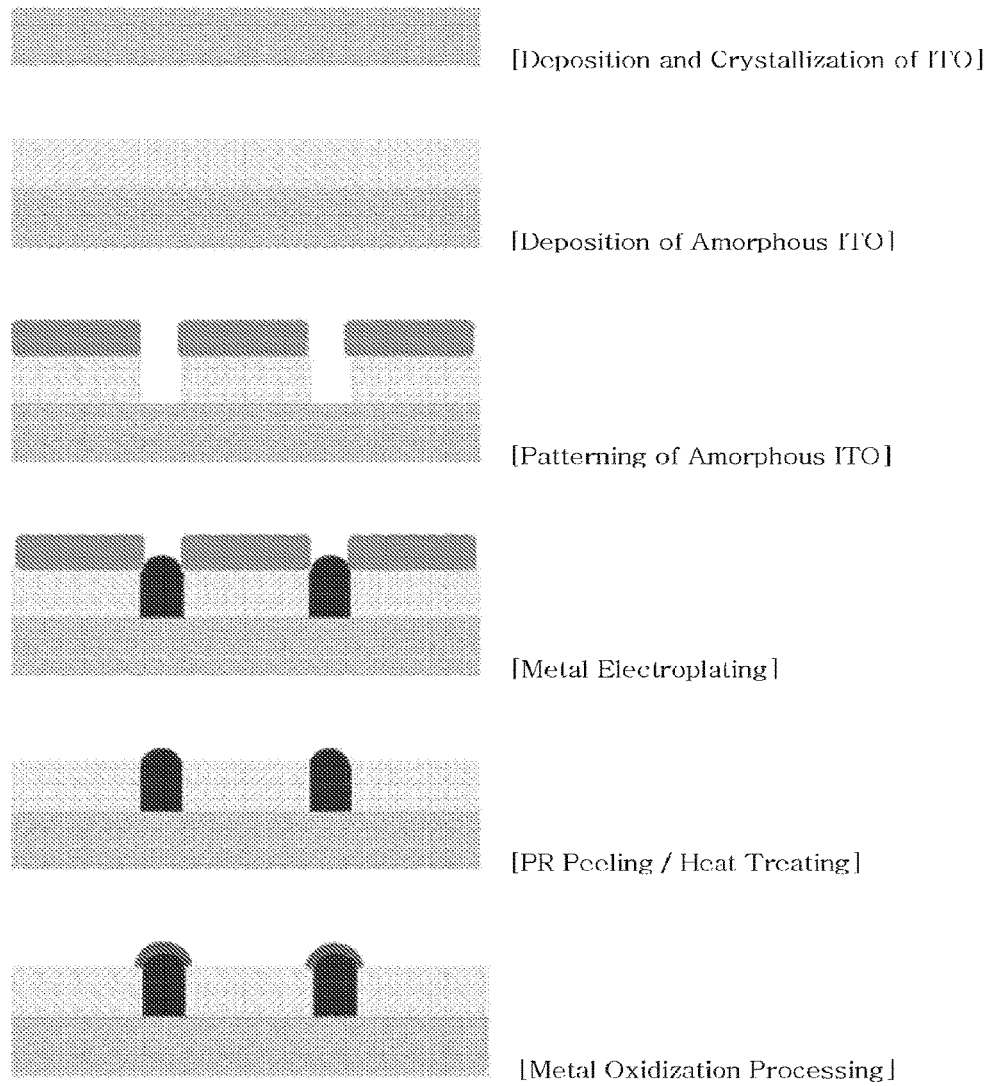

[Figure 4]
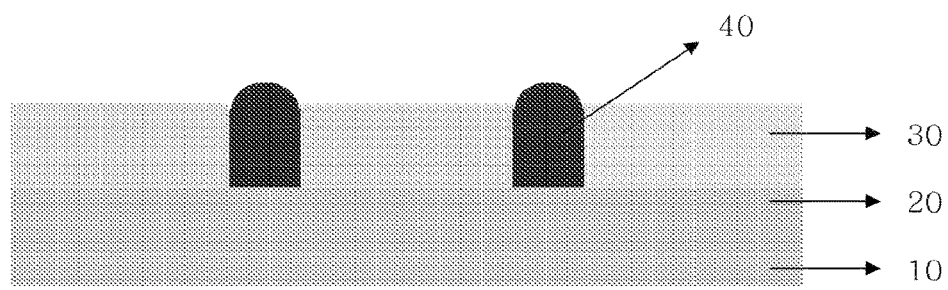
[Figure 5]
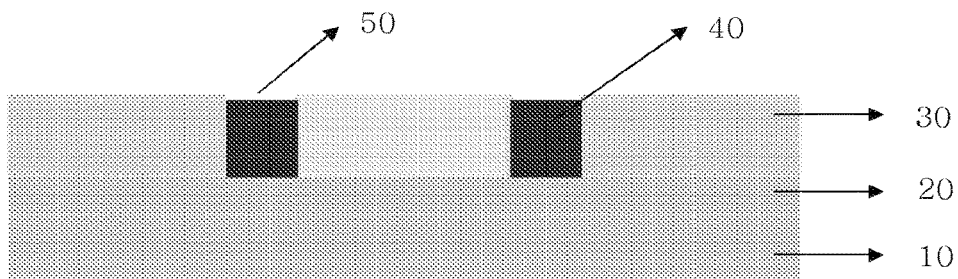
[Figure 6]
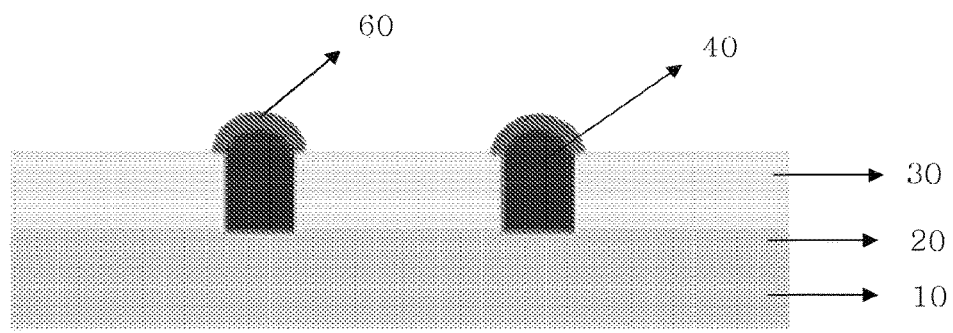

[Figure 7]
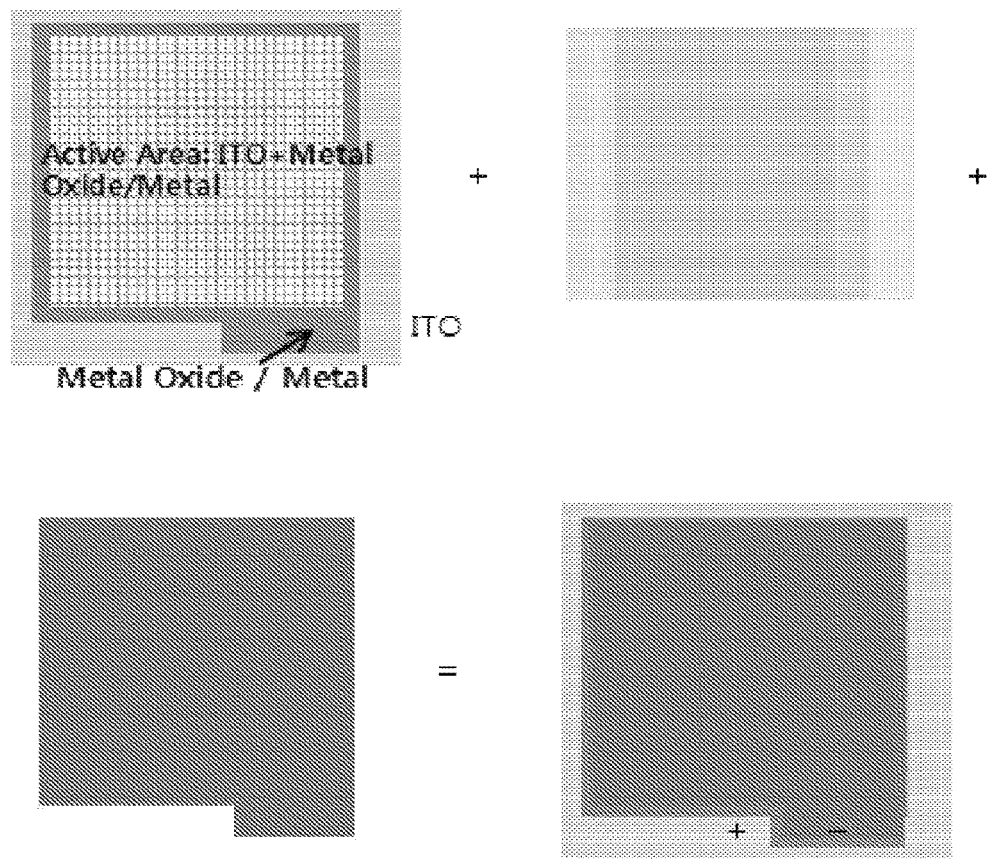

CONDUCTIVE SUBSTRATE AND METHOD FOR MANUFACTURING SAME

This application is a divisional of U.S. application Ser. No. 14/442,964 filed on May 14, 2015, which is a 35 U.S.C. § 371 National Stage entry of International Application No. PCT/KR2013/011072 filed on Feb. 12, 2013, which claims priority to Korean Patent Application Nos. 10-2012-0138364 and 10-2012-0138340, filed on Nov. 30, 2012, all of which are incorporated by reference in their entirety herein.

TECHNICAL FIELD

The present invention relates to a conducting substrate and a method for preparing the same.

BACKGROUND ART

In the related art, a cathode electrode of an organic light emitting device, an organic solar cell, or the like basically uses indium tin oxide (ITO) as a primary electrode and primarily uses a secondary electrode made of metal in order to prevent loss of optical efficiency by high resistance of the ITO, and the like.

In a method for forming the secondary electrode, the secondary electrode may be formed by depositing and patterning metal on ITO which is fully deposited on a substrate, passivating metal again or forming the secondary electrode at a groove portion of a substrate with a groove, and thereafter, depositing the ITO as the primary electrode thereon. However, this method is not a reasonable method because the number of processes is many and an increase in price of a substrate occurs.

DETAILED DESCRIPTION OF THE INVENTION

Technical Problem

In the art, a research on a conducting substrate which is excellent in performance and easy in a preparation method, and a method for preparing the same is required.

Technical Solution

The present invention provides a method for preparing a conducting substrate comprising:
1) forming a crystalline transparent conducting layer on a substrate;
2) forming an amorphous transparent conducting layer on the crystalline transparent conducting layer;
3) forming at least one pattern open region so as to expose a part of the crystalline transparent conducting layer by patterning the amorphous transparent conducting layer; and
4) forming a metal layer in the at least one pattern open region.

Further, the present invention provides a conducting substrate comprising:
a substrate;
a first transparent conducting layer provided on the substrate; and
a second transparent conducting layer provided on the first transparent conducting layer,
wherein the second transparent conducting layer comprises a metal pattern therein.

Further, the present invention provides a privacy film comprising the conducting substrate.

In addition, the present invention provides an electronic device comprising the conducting substrate.

Advantageous Effects

According to exemplary embodiments of the present invention, an efficient conducting substrate can be formed by a simple process. Further, in the present invention, an amorphous transparent conducting layer and a metal layer are introduced to minimize resistance loss of a crystalline transparent conducting layer.

Further, according to exemplary embodiments of the present invention, since the conducting substrate can be prepared without introducing an additional insulating layer formed on a secondary substrate in the related art, the number of processes can be reduced, and as a result, the competitive price can be secured.

BRIEF DESCRIPTION OF DRAWINGS

FIGS. 1, 2, and 3 are diagrams schematically illustrating a method for preparing a conducting substrate according to an exemplary embodiment of the present invention.

FIGS. 4, 5, and 6 are diagrams schematically illustrating a conducting substrate according to an exemplary embodiment of the present invention.

FIG. 7 are diagrams illustrating an organic light emitting device according to an exemplary embodiment of the present invention.

EXPLANATION OF SYMBOLS FOR THE MAJOR PARTS OF THE DRAWINGS

10: Substrate
20: First transparent conducting layer
30: Second transparent conducting layer
40: Metal layer
50: Pattern open region
60: Metal oxide layer

BEST MODE

Hereinafter, the present invention will be described in more detail.

A method for preparing a conducting substrate according to an exemplary embodiment of the present invention comprises: 1) forming a crystalline transparent conducting layer on a substrate; 2) forming an amorphous transparent conducting layer on the crystalline transparent conducting layer; 3) forming at least one pattern open region so as to expose a part of the crystalline transparent conducting layer by patterning the amorphous transparent conducting layer; and 4) forming a metal layer in the at least one pattern open region.

In the method for preparing a conducting substrate according to the exemplary embodiment of the present invention, the crystalline transparent conducting layer is formed on the substrate in step 1).

The substrate is not particularly limited and may use a material known in the art. For example, glass, a plastic substrate, a plastic film, or the like may be used, but the present invention is not limited thereto.

Step 1) is performed by a method of forming the amorphous transparent conducting layer on the substrate and thereafter, heat-treating the amorphous transparent conducting layer, or performing high-temperature deposition in a deposition process. In more detail, the amorphous transparent conducting layer is formed on the substrate by a deposition process or a coating process by using a material for the amorphous transparent conducting layer, and thereafter, the amorphous transparent conducting layer may be crystallized by heat treatment and high-temperature deposition is performed from a deposition step, thereby achieving the high-temperature deposition. Those skilled in the art may select and use the method of forming the crystalline transparent conducting layer according to a glass transition temperature (Tg) of the used substrate. As a detailed example of the heat treatment method, when the crystalline transparent conducting layer is formed on a substrate having a low glass transition temperature such as a polyethylene terephthalate (PET) film, deposition is performed at 120° C. as a deposition temperature of a transparent conducting material and thereafter, the transparent conducting material is additionally heat-treated under an Ar atmosphere at 150° C. for 30 to 50 minutes to acquire the crystalline transparent conducting layer. Further, when the crystalline transparent conducting layer is formed on a substrate having a high Tg such as glass, deposition is performed by increasing the temperature of a chamber at the time of depositing the transparent conducting material at 200° C. or higher, thereby achieving the deposition. Those skilled in the art may select this according to the substrate and an object.

The crystalline transparent conducting layer may comprise one or more selected from the group consisting of indium oxide, zinc oxide, indium tin oxide, indium zinc oxide, and a transparent conducting polymer and the present invention is not limited only thereto.

In the method for preparing a conducting substrate according to the exemplary embodiment of the present invention, the amorphous transparent conducting layer is formed on the crystalline transparent conducting layer in step 2).

In this case, the amorphous transparent conducting layer may be formed by the aforementioned material and the method of the crystalline transparent conducting layer.

In the method for preparing a conducting substrate according to the exemplary embodiment of the present invention, at least one pattern open region is formed to expose a part of the crystalline transparent conducting layer by patterning the amorphous transparent conducting layer in step 3).

Patterning of the amorphous transparent conducting layer may be performed by a photolithography method and the present invention is not limited only thereto. As one example, a partial pattern of an amorphous ITO region is crystallized through a laser and thereafter, the crystallized pattern is immersed in an oxalic acid etching solution to achieve the pattern by using etching selectivity.

Since the crystalline transparent conducting layer provided below the amorphous transparent conducting layer is not etched during a patterning process of the amorphous transparent conducting layer, it is possible to form a pattern of the transparent conducting layer with a step.

That is, the amorphous transparent conducting layer may be patterned by using an etching solution, and only the amorphous transparent conducting layer may be selectively patterned by a difference in solubility between the amorphous transparent conducting layer and the crystalline transparent conducting layer to the etching solution. As the etching solution, a material known in the art may be used by considering a difference in solubility between the amorphous transparent conducting layer and the crystalline transparent conducting layer. In general, a composite of hydrochloric acid: nitric acid: water=4:1:5 is used for etching the crystalline transparent conducting layer, but oxalic acid based materials, and the like may be used in a process of patterning the amorphous transparent conducting layer of the present invention and the present invention is not limited only thereto.

In a more detailed example, in the process of patterning the amorphous transparent conducting layer, an etching process may be performed by using an oxalic acid solution of 5% and in this case, since a difference in etching speed between the lower crystalline transparent conducting layer to the amorphous transparent conducting layer for oxalic acid occurs, the lower crystalline transparent conducting layer is not etched but may remain.

In this case, a difference in solubility depending on an etching solution between the amorphous transparent conducting layer and the crystalline transparent conducting layer may be changed depending on a composition constituting the transparent conducting layer, but a characteristic part may be a general phenomenon in which as a partial section of the amorphous transparent conducting layer is crystallized with an epitaxial growth on an interface between the amorphous transparent conducting layer and the crystalline transparent conducting layer, the thickness of the pattern open region which may be acquired after etching is smaller than the thickness of the actually deposited amorphous transparent conducting layer.

The crystallizing process of the upper amorphous transparent conducting layer may be performed depending on selection by those skilled in the art as necessary after the patterning is performed in such a manner.

In the method for preparing a conducting substrate according to the exemplary embodiment of the present invention, the at least one pattern open region is formed and thereafter, the metal layer is formed on in the region in step 4).

The metal layer may comprise one or more selected from the group consisting of silver, aluminum, copper, neodymium, molybdenum, and an alloy thereof, but the present invention is not limited only thereto. The metal layer may be formed by a deposition process or electroplating.

When the metal layer is formed by electroplating, a photolithography process for patterning the amorphous transparent conducting layer may be performed without removing photoresist, and since the electroplating is performed within the pattern open region where the crystalline transparent conducting layer is exposed, a structure in which the crystalline transparent conducting layer and the metal layer exist in parallel may be formed. In this case, a region where the electroplating is performed may be achieved only within the pattern open region where the crystalline transparent conducting layer is exposed. In particular, the metal layer is formed by electroplating, and as a result, a top part of the metal layer has a hemisphere shape by surface tension. Therefore, thereafter, when an additional material is deposited, stack coverage may be improved. Thereafter, a final conducting substrate may be prepared by removing the photoresist and heat-treating the metal layer.

As described above, as the exemplary embodiment of the present invention, the method for preparing a conducting substrate, which comprises the forming of the metal layer by using the electroplating, is illustrated in FIG. 1 below.

Further, when the metal layer is formed by using the deposition process, the photography process for patterning the amorphous transparent conducting layer may be performed without removing the photoresist and the metal layer may be formed in the pattern open region where the crystalline transparent conducting layer is exposed. Thereafter, a final conducting substrate may be prepared by removing the photoresist through lift-off and heat-treating the metal layer.

As described above, as the exemplary embodiment of the present invention, the method for preparing a conducting substrate, which comprises the forming of the metal layer by using the deposition process, is illustrated in FIG. 2 below.

An insulating layer comprising an organic material may be additionally formed on the metal layer as necessary.

Further, the method for preparing a conducting substrate according to the exemplary embodiment of the present invention may further comprise heat-treating the amorphous transparent conducting layer, after step 3) or 4). By the heat-treatment process, the amorphous transparent conducting layer may be crystallized and the metal layer may be compacted.

Whether the transparent conducting layer is crystallized may be judged by measuring resistance of the transparent conducting layer. In this case, when the resistance shows a resistance value of the crystallized transparent conducting layer, it is primarily judged that the crystallization is completed, but when a large change in resistance value is observed by additionally dipping the transparent conducting layer in the etching solution for the amorphous transparent conducting layer in association with whether sufficient crystallizing is performed, it may be judged that the crystallization is not sufficiently achieved. The reason is that the resistance is not significantly increased because a reaction of the sufficiently crystallized transparent conducting layer to a metallic etching solution is small.

Another method of measuring crystallinity of the transparent conducting layer is a method of observing a planar grain size of the crystallized transparent conducting layer. In a case of performing additional heat-treatment through an additional method after performing the patterning process of the amorphous transparent conducting layer by forming the crystalline transparent conducting layer and the amorphous transparent conducting layer based on the same thickness, when the grain size is similar to a grain size of the crystalline transparent conducting layer region, it may be judged that the amorphous transparent conducting layer is crystallized.

Yet another method of measuring crystallinity of the transparent conducting layer is a method of observing a cross-sectional structure of a prepared sample. When the cross-sectional structure is observed, a growth is performed in a pillar-shaped structure having a form in which a lower part of a grain growth of the crystalline transparent conducting layer is small and an upper part of the grain growth is large, and in this case, when a thin film of the upper amorphous transparent conducting layer is additionally crystallized, a new pillar-shaped structure which is grown and raised on the top of the pillar-shaped structure of the crystalline transparent conducting layer again and an interface therebetween may be verified.

Last, the simplest method of judging crystallization is a method of measuring sheet resistance. For example, since sheet resistance of amorphous ITO is approximately 270Ω/□ and sheet resistance of crystalline ITO is approximately 50Ω/□, sheet resistance of the transparent conducting layer is measured before/after the crystallization to judge whether the transparent conducting layer is crystallized.

Further, the method for preparing a conducting substrate according to the exemplary embodiment of the present invention may further comprise forming a metal oxide layer on the metal layer, after step 4).

The metal oxide layer may be formed by dipping the metal layer in an oxidizer solution. In more detail, an oxidizing reaction is induced only in a surface part of the metal layer, which is selectively exposed, by dipping the metal layer in the oxidizer solution, and as a result, the metal oxide layer is formed on the metal layer. The metal oxide layer may serve as an insulating layer of the metal layer.

The oxidizer solution may adopt a material known in the art without a particular restriction so long as the oxidizer solution is a material which may oxidize the metal layer. For example, when the metal layer comprises Cu, NaOH may be used as the oxidizer solution, and as a result, the metal oxide layer of CuO may be formed on the top surface of the metal layer. In this case, reactivity between NaOH and the crystalline transparent conducting layer does not exist, thereby not influencing conductivity.

As described above, as the exemplary embodiment of the present invention, the method for preparing a conducting substrate, which additionally comprises the forming of the metal oxide layer on the metal layer, is illustrated in FIG. 3 below.

Further, the conducting substrate according to the exemplary embodiment of the present invention comprises: a substrate; a first transparent conducting layer provided on the substrate; and a second transparent conducting layer provided on the first transparent conducting layer, and the second transparent conducting layer comprises a metal pattern therein.

In the conducting substrate according to the exemplary embodiment of the present invention, since the substrate, the transparent conducting layer, the metal layer, and the like are described as above, a detailed description thereof will be omitted.

The metal pattern provided in the second transparent conducting layer may be formed by forming the amorphous transparent conducting layer on a first transparent conducting layer which is the crystalline transparent conducting layer; forming at least one pattern open region so as to expose the first transparent conducting layer by patterning the amorphous transparent conducting layer; and forming the metal layer in the at least one pattern open region, as described above.

In the conducting substrate according to the exemplary embodiment of the present invention, the first transparent conducting layer and the second transparent conducting layer are provided to contact each other, composition materials of both surfaces of the first transparent conducting layer and the second transparent conducting layer, which contact each other, may be the same as each other.

Further, the first transparent conducting layer and the second transparent conducting layer are provided to contact each other, and a grain structure observed from the viewpoint of the surfaces where the first transparent conducting layer and the second transparent conducting layer contact each other may have a form in which an upper part and a lower part contact each other with a boundary in a structure having a pillar shape in which upper and lower widths are different from each other.

The thickness of the metal pattern may be smaller than that of the second transparent conducting layer, but is not limited only thereto. Further, the thickness of the metal pattern may be 80 to 120% of the thickness of the second transparent conducting layer, but is not limited only thereto.

The respective thicknesses of the first transparent conducting layer, the second transparent conducting layer, and the metal pattern may be independently 50 to 2,000 nm, but are not limited only thereto.

In the conducting substrate according to the exemplary embodiment of the present invention, the second transparent conducting layer may comprise a second transparent conducting pattern and at least one pattern open region, and the metal pattern may be provided in the at least one pattern open region. In this case, an upper area of the metal pattern may be 20% or more and less than 100% of an upper area of the pattern open region, and an upper area of the metal pattern may be 80% or more and less than 100% of the upper area of the pattern open region, but the present invention is not limited only thereto.

In the conducting substrate according to the exemplary embodiment of the present invention, when the thickness of the second transparent conducting layer is set as D and the height of the top is set as 0, a position D2 of the top of the metal pattern may satisfy Equation 1 below.

$$-0.2D<D2<0.2D \qquad \text{[Equation 1]}$$

Further, the position D2 of the top of the metal pattern may satisfy Equation 2 below.

$$-0.8D<D2<D \qquad \text{[Equation 2]}$$

Since the metal layer is formed in the pattern open region where the first transparent conducting layer is exposed, the top of the first transparent conducting layer may contact the bottom of the metal pattern, and as a result, the first transparent conducting layer and the metal layer may be electrically connected with each other.

A plane shape of the metal pattern may have various pattern shapes comprising a regular pattern structure, an irregular pattern structure, and the like, and an aperture ratio may be controlled according to selection by those skilled in the art.

An interface between the metal pattern and the second transparent conducting layer may be vertical to the first transparent conducting layer. Further, the interface between the metal pattern and the second transparent conducting layer may maintain a predetermined angle clockwise to the top of the first transparent conducting layer. For example, the interface may have angles of 10 to 170 °, 30 to 150°, and the like clockwise to the top of the first transparent conducting layer. The angles may be naturally formed during the preparation process.

The height/the width of the metal pattern may be equal to or less than 1 and ⅓ to 1, but is not limited only thereto.

In the conducting substrate according to the exemplary embodiment of the present invention, a metal oxide pattern, a metal nitride pattern, or a metal oxynitride pattern may be additionally comprised on the metal pattern. The metal oxide pattern, the metal nitride pattern or the metal oxynitride pattern may serve as an insulating layer of the metal pattern. The metal oxide pattern, the metal nitride pattern or the metal oxynitride pattern may be provided on the top of the metal pattern and may also be provided on the side of the metal pattern exposed on the second transparent conducting layer.

In the conducting substrate according to the exemplary embodiment of the present invention, at least one surface of the metal pattern does not contact the first transparent conducting layer and the second transparent conducting layer, and the metal oxide pattern, the metal nitride pattern or the metal oxynitride pattern may be additionally comprised on at least one surface of the metal pattern, which does not contact the first transparent conducting layer and the second transparent conducting layer.

The metal oxide layer may be formed by dipping the metal layer in the oxidizer solution or by heat-treating the corresponding substrate under an oxygen atmosphere. In more detail, an oxidizing reaction is induced only in a surface part of the metal layer, which is selectively exposed, by dipping the metal layer in the oxidizer solution or heat-treating the corresponding substrate under the oxygen atmosphere, and as a result, the metal oxide layer is formed on the metal layer. The metal oxide layer may serve as the insulating layer or a non-emission layer of the metal layer. When the layer is described for the purpose of serving as the insulating layer, the corresponding layer need not absolutely be an oxide layer and may be a nitride layer as necessary. However, since both the oxide layer and the nitride layer are easily acquired through degeneration of the corresponding metal, the metal pattern and the metal oxide layer may comprise the same metal.

The present invention may provide a privacy film comprising the conducting substrate.

The present invention provides an electronic device comprising the conducting substrate.

The electronic device may be an organic light emitting device, an organic light emitting device illumination, an organic solar cell, a touch screen, or a display, but is not limited only thereto.

FIG. 7 below illustrates an example of an organic light emitting device according to an exemplary embodiment of the present invention. As illustrated in FIG. 7 below, the organic light emitting device according to the exemplary embodiment of the present invention may form an insulating layer region (orange color) naturally formed on an outer perimeter of a screen part (light emitting region) of the substrate, and has an advantage in that the device may be prepared without an additional PAD forming process for forming a terminal of an electrode unlike the related art when a deposition process of an organic light emitting device material and deposition of a counter electrode are formed to have a structure of a light emitting region< an organic light emitting device material deposition region< an insulating layer region, a light emitting region< a counter electrode region< the organic light emitting device material deposition region< the insulating layer region.

In more detail, the conducting substrate may be used as the electrode in the electronic device. In this case, the first transparent conducting layer may be used as a primary electrode and the metal pattern may be used as a secondary electrode.

The conducting substrate according to the exemplary embodiment of the present invention is illustrated in FIGS. 4 to 6 below.

According to exemplary embodiments of the present invention, an efficient conducting substrate can be formed by a simple process. Further, in the present invention, an amorphous transparent conducting layer and a metal layer are introduced to minimize resistance loss of a crystalline transparent conducting layer.

[Best Mode]

Hereinafter, the present invention will be described in more detail with reference to the Examples. However, the following Examples are set forth to illustrate the present invention, but the scope of the present invention is not limited thereto.

EXAMPLES

Example 1

1) Forming Crystalline Transparent Conducting Layer on Glass Substrate

A crystalline indium tin oxide (ITO) thin film having a thickness of 300 nm was formed on a glass substrate by using materials and conditions described below. Specific resistance of the prepared crystalline ITO thin film was $2\times10^{-4}\Omega$cm.

Deposition temperature: 400° C. (using RF Magnetron sputter)

Target: $In_2O_3$:$SnO_2$=90 mol %:10 mol % purity 99.99% (Cerac Co)

RF Power: 150 W

Deposition Conditions: deposition time (30 min), pressure (10 mtorr)

Post heat treatment: 400° C. for 1 min

2) Forming Amorphous Transparent Conducting Layer on Crystalline Transparent Conducting Layer An amorphous ITO thin film having a thickness of 300 nm was formed on a crystalline ITO thin film by using materials, equipment, and conditions below. Specific resistance of the prepared amorphous ITO thin film was $10\times10^{-4}\Omega$cm.

Deposition temperature: 110° C. (using RF Magnetron sputter)

Target: $In_2O_3$:$SnO_2$=90 mol %:10 mol % purity 99.99% (Cerac Co)

RF Power: 150 W

Deposition Conditions: deposition time (30 min), pressure (10 mtorr)

Post heat treatment: 400° C. for 1 min

3) Patterning Amorphous Transparent Conducting Layer

The prepared amorphous ITO thin film was exposed with an exposer (Karl Suss, 30 mJ) by using photoresist (JC 800, Dongjin Semi Chem) and thereafter, developed with TMAH (2.38%, tetramethylammonium hydroxide) for 45 sec. Thereafter, the developed thin film was etched with an oxalic acid solution (3%) at 40° C. for 5 min.

4) Metal Electroplating

A Cu seed layer was deposited on a pattern with the photoresist with approximately 20 nm through a sputtering process and thereafter, forward pulsed current was used through substrates serving as an anode and a cathode solved with a $CuSO_4$ sulphate ($CuSO_4$. $5H_2O$ 90 g/l $H_2SO_4$ 180 g/l) and a power supply device, and the substrate was placed to serve as a negative pole and Cu was grown thereon. In this case, Cu plating current density was maintained at approximately 60 mA/cm².

Example 2

After the metal electroplating according to Example 1 above, a metal oxide layer was formed by heat treatment at 500° C. for approximately 30 min under an oxygen atmosphere by using RTA equipment through electroless plating.

According to exemplary embodiments of the present invention, an efficient conducting substrate can be formed by a simple process. Further, in the present invention, an amorphous transparent conducting layer and a metal layer are introduced to minimize resistance loss of a crystalline transparent conducting layer.

Further, according to exemplary embodiments of the present invention, since the conducting substrate can be prepared without introducing an additional insulating layer formed on a secondary substrate in the related art, the number of processes can be reduced, and as a result, the competitive price can be secured.

The invention claimed is:

1. A method for preparing a conducting substrate, the method comprising:
    1) forming a crystalline transparent conducting layer on a substrate;
    2) forming an amorphous transparent conducting layer on the crystalline transparent conducting layer;
    3) forming at least one pattern open region so as to expose a part of the crystalline transparent conducting layer by patterning the amorphous transparent conducting layer; and
    4) forming a metal layer on the part of the crystalline transparent conducting layer exposed in the at least one pattern open region.

2. The method of claim 1, wherein step 1) is performed by a method of forming the amorphous transparent conducting layer on the substrate and thereafter, heat-treating the amorphous transparent conducting layer.

3. The method of claim 1, wherein step 1) is performed by a method of high-temperature depositing a material for a transparent conducting layer on the substrate.

4. The method of claim 1, wherein the crystalline transparent conducting layer and the amorphous transparent conducting layer comprise one or more selected from the group consisting of indium oxide, zinc oxide, indium tin oxide, indium zinc oxide, and a transparent conducting polymer.

5. The method of claim 1, wherein patterning of the amorphous transparent conducting layer is performed by a photolithography method.

6. The method of claim 1, wherein the amorphous transparent conducting layer is patterned by using an etching solution, and
    only the amorphous transparent conducting layer is selectively patterned by a difference in solubility between the amorphous transparent conducting layer and the crystalline transparent conducting layer to the etching solution.

7. The method of claim 6, wherein the etching solution comprises an oxalic acid based material.

8. The method of claim 1, wherein the metal layer comprises one or more selected from the group consisting of silver, aluminum, copper, neodymium, molybdenum, and an alloy thereof.

9. The method of claim 1, wherein the metal layer is formed by a deposition process or electroplating.

10. The method of claim 1, further comprising:
    heat-treating the amorphous transparent conducting layer, after step 3) or 4).

11. The method of claim 1, further comprising:
    forming a metal oxide layer on the metal layer, after step 4).

12. The method of claim 11, wherein the metal oxide layer is formed by dipping the metal layer in an oxidizer solution.

13. The method of claim 1, wherein the crystalline transparent conducting layer and the amorphous transparent conducting layer comprise one or more selected from the group consisting of indium oxide, zinc oxide, indium tin oxide, indium zinc oxide, and a transparent conducting polymer.

14. The method of claim 1, wherein the metal layer comprises one or more selected from the group consisting of silver, aluminum, copper, neodymium, molybdenum, and an alloy thereof.

* * * * *